US011333696B2

(12) United States Patent
Gajda

(10) Patent No.: US 11,333,696 B2
(45) Date of Patent: May 17, 2022

(54) MUTUAL CAPACITANCE MEASUREMENT

(71) Applicant: Nordic Semiconductor ASA, Trondheim (NO)

(72) Inventor: Bartosz Gajda, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/255,933

(22) PCT Filed: Jun. 26, 2019

(86) PCT No.: PCT/EP2019/067038
§ 371 (c)(1),
(2) Date: Dec. 23, 2020

(87) PCT Pub. No.: WO2020/002449
PCT Pub. Date: Jan. 2, 2020

(65) Prior Publication Data
US 2021/0117046 A1 Apr. 22, 2021

(30) Foreign Application Priority Data
Jun. 28, 2018 (GB) ...................... 1810602

(51) Int. Cl.
*G01R 27/26* (2006.01)
*G06F 3/044* (2006.01)
(Continued)

(52) U.S. Cl.
CPC ..... *G01R 27/2605* (2013.01); *G01R 19/1659* (2013.01); *G06F 3/0416* (2013.01); *G06F 3/0445* (2019.05)

(58) Field of Classification Search
CPC . G06F 3/0445; G06F 3/0416; G01R 19/1659; G01R 27/2605
See application file for complete search history.

(56) References Cited

U.S. PATENT DOCUMENTS 8,319,505 B1 * 11/2012 Maharyta ........... G01R 27/2605
324/658
8,779,783 B1 * 7/2014 Liepold ................ H03K 17/962
324/686
(Continued)

FOREIGN PATENT DOCUMENTS

JP 2010 245906 A 10/2010
WO WO 2009/078944 A1 6/2009

OTHER PUBLICATIONS

International Search Report and Written Opinion for PCT/EP2019/067038, dated Sep. 20, 2019, 16 pages.
(Continued)

*Primary Examiner* — Fred Tzeng
(74) *Attorney, Agent, or Firm* — Klarquist Sparkman, LLP

(57) ABSTRACT

A circuit portion for indicating a mutual capacitance between a first and second node is provided. The circuit portion comprises a switchable constant current source arrangement configured to supply a first current to the first node in a first direction or a second current to the first node in a second, opposite direction; a variable voltage source configured to output a voltage to the second node so as to hold the first node at a reference voltage; and a comparator arrangement configured to switch between said first and second directions of the constant current source when the voltage output by the variable voltage source reaches a lower threshold voltage or an upper threshold voltage and to output a signal in synchrony with said constant current direction switching. The signal is indicative of the mutual capacitance between the first and second nodes.

13 Claims, 3 Drawing Sheets

(51) Int. Cl.
*G01R 19/165* (2006.01)
*G06F 3/041* (2006.01)

(56) References Cited

U.S. PATENT DOCUMENTS

| | | | | |
|---|---|---|---|---|
| 8,896,328 | B2* | 11/2014 | Reynolds | G06F 3/04166 |
| | | | | 324/686 |
| 8,913,021 | B2* | 12/2014 | Elias | G06F 3/0446 |
| | | | | 345/173 |
| 8,952,922 | B2* | 2/2015 | Lin | G06F 3/0446 |
| | | | | 345/174 |
| 9,201,547 | B2* | 12/2015 | Elias | G06F 3/0418 |
| 9,383,395 | B1 | 7/2016 | Ogirko et al. | |
| 9,582,123 | B2* | 2/2017 | Tiruvuru | G06F 3/044 |
| 9,778,713 | B2* | 10/2017 | Reynolds | G06F 3/0446 |
| 9,933,879 | B2* | 4/2018 | Yao | G06F 3/041662 |
| 10,139,948 | B2* | 11/2018 | Zhu | G06F 3/0412 |
| 10,514,403 | B2* | 12/2019 | Kuang | G06F 3/04166 |
| 10,928,431 | B2* | 2/2021 | Lamesch | H03K 17/955 |
| 10,990,215 | B2* | 4/2021 | Wen | G06F 3/044 |
| 2011/0175835 | A1 | 7/2011 | Wang | |
| 2011/0175847 | A1 | 7/2011 | Wang et al. | |
| 2012/0043971 | A1* | 2/2012 | Maharyta | H03K 17/962 |
| | | | | 324/658 |

OTHER PUBLICATIONS

IPO Search Report under Section 17(5) for GB1810602.1, dated Jan. 22, 2019, 3 pages.

* cited by examiner

MUTUAL CAPACITANCE MEASUREMENT

CROSS REFERENCE TO RELATED APPLICATIONS

This is the U.S. National Stage of International Application No. PCT/EP2019/067038, filed Jun. 26, 2019, which was published in English under PCT Article 21(2), which in turn claims the benefit of Great Britain Application No. 1810602.1, filed Jun. 28, 2018.

The present invention relates to a method of measuring mutual capacitance.

In recent years there has been a rapid expansion in the demand for electronic devices with touch-sensitive inputs: typically in the form of 'touch-pads' as commonly found in laptop computers for controlling the movement of an on-screen cursor; or in touch-screens as commonly found in smart-phones, tablet computers, and increasingly in screens for laptop and desktop computers.

There are several different technologies which can provide touch-sensitive inputs for electronic devices but the leading approach is to use capacitive sensing. There are several different implementations of capacitive sensing, but each relies on the fact that the effective capacitance of a capacitive plate (or the mutual capacitance of a pair of plates) is affected when a finger is brought into close proximity. Monitoring the capacitance of the plate(s) can therefore allow the presence of a finger to be determined.

One common touch screen implementation is referred to as projected capacitive technology (or "pro-cap"). This utilises a stack of two electrode grids separated by a dielectric layer and located beneath an outer (usually glass) touch surface. One grid forms a series of rows and the other a series of columns. The mutual capacitance at each intersection (i.e. between each row and column) is measured sequentially and the results analysed to determine the position of one or more touches on the surface.

Measuring the mutual capacitance at each intersection quickly enough to assess touch locations accurately and with a reasonable refresh rate (e.g. 100 Hz), however, presents a significant challenge and typically requires the use of complex circuitry. An alternative approach is desirable.

From a first aspect, the present invention provides a circuit portion for indicating a mutual capacitance between a first and second node, the circuit portion comprising:
- a switchable constant current source arrangement configured to supply a first current to the first node in a first direction or a second current to the first node in a second, opposite direction;
- a variable voltage source configured to output a voltage to the second node so as to hold the first node at a reference voltage; and
- a comparator arrangement configured to switch between said first and second directions of the constant current source when the voltage output by the variable voltage source reaches a lower threshold voltage or an upper threshold voltage and to output a signal in synchrony with said constant current direction switching;

wherein the signal is indicative of the mutual capacitance between the first and second nodes.

Thus it will be seen by those skilled in the art that, in accordance with the invention, the frequency of the signal output from the comparator arrangement may be used to determine the mutual capacitance of between the first and second nodes, since this is related to the speed with which the upper and lower threshold voltages are reached. This may allow accurate determination of the mutual capacitance whilst reducing circuit complexity. Moreover, because the voltage at the first node is held at the reference voltage value, its self-capacitance (relative to ground) does not change throughout the measurement process. Isolating the self-capacitance in this way is advantageous, as it may avoid the result of the measurement being dominated by the self-capacitance, which would decrease the achievable accuracy of the mutual capacitance measurement.

In use, the first current is supplied by the constant current source arrangement to the first node in the first direction and the variable voltage source outputs a decreasing voltage to the second node to hold the first node at the reference voltage. The voltage output by the variable voltage source eventually reaches the lower threshold voltage and the comparator arrangement switches the direction of the constant current to the second direction. The voltage output by the variable voltage source to maintain the reference voltage at the first node thus begins to increase.

The voltage output by the variable voltage source subsequently reaches the upper threshold voltage, and the direction of the constant current is switched back to the first direction. This pattern continues, such that the output of the variable voltage source section oscillates in a triangular wave.

As will be appreciated by those skilled in the art, the mutual capacitance represents the capacity of the first and second nodes to hold charge at a certain voltage, and as such, a change in the mutual capacitance between the first and second nodes (e.g. due to the presence of a user's fingertip close to the two nodes) results in a change in the rate at which the voltage at the second node changes to maintain the reference voltage at the first node (for a given fixed magnitude of current supplied to the first node).

Therefore, the rate at which the output voltage from the variable voltage source increases or decreases (and thus the frequency at which the current direction is switched) is proportional to the mutual capacitance between the first and second nodes. The frequency of the signal output from the comparator arrangement (which is equal to the frequency of switching), can therefore be used to determine the mutual capacitance between the first and second nodes. The circuit portion may comprise a frequency measurement section which is arranged to measure the frequency of the signal output from the comparator arrangement and to use the measured frequency to determine said mutual capacitance.

Although not essential, the first and second currents supplied by the constant current source arrangement preferably have the same magnitude (i.e. they are exactly opposite). In such cases, the voltage output by the variable voltage source increases and decreases at the same rate (i.e. its output comprises a symmetrical triangular wave), and the signal output from the comparator arrangement has an even duty cycle. This can enable more accurate and easier measurement of its frequency and thus of the mutual capacitance (i.e. it may require fewer cycles to determine accurately the mutual capacitance).

The frequency of the signal output by the comparator depends upon physical properties of the mutual capacitance (e.g. distance between the plates, etc.) and the applied currents. In typical implementations the frequency may range from tens to hundreds of kHz.

The time needed to accurately determine the frequency of the signal output from the comparator arrangement for a single measurement depends on a frequency of a fast reference clock. It may be required to average the frequency of the signal over several cycles, to improve accuracy. A measurement time of 0.1 ms or less is expected to be practicable, corresponding to a measurement rate in the range of ~10 kHz.

The signal output by the comparator arrangement may be derived indirectly from the constant current direction switching although in a set of preferred embodiments the output signal comprises a signal used to drive the constant current direction switching.

In preferred embodiments the variable voltage source comprises an operational amplifier. The operational amplifier may be configured in a negative feedback configuration, i.e. with a negative feedback loop between an output and an input of the operation amplifier comprising the mutual capacitance between the first and second nodes. The mutual capacitance is preferably connected between the output and an inverting input of the operational amplifier. A non-inverting input of the amplifier is preferably connected to a voltage source which outputs the reference voltage. In such embodiments the operational amplifier, the constant current source arrangement and the mutual capacitance of the first and second nodes together comprise an integrator circuit.

The comparator arrangement preferably comprises a comparator with first and second inputs and a digital output. The first input of the comparator may be connected to the output of the variable voltage source and the second input (to which the first input is compared) may be connected to a switchable reference voltage source, which is switchable between providing the lower threshold voltage and the upper threshold voltage. In such embodiments the comparator arrangement may be further configured to switch the switchable reference voltage between the first reference voltage and the second reference voltage when the voltage output by the variable voltage source reaches the lower threshold voltage or the upper threshold voltage.

Alternatively, two comparators may be used, each with a first input connected to the output of the variable voltage source and a second input of each comparator connected to the lower threshold voltage and the upper threshold voltage respectively.

In such embodiments the signal output by the comparator arrangement comprises the digital output of the comparator. The digital output has a high value when the voltage at the first input is greater than that at the second input and a low value when the voltage at the first input is lower than that at the second input. Because the variable voltage source oscillates between the first and second reference voltages, the signal output by the comparator arrangement comprises a square wave, the frequency of which may be easy to determine with simple circuitry.

As mentioned above, mutual capacitance measurement is often used to enable touch-sensitive inputs. As such, the present invention extends to a touch interface comprising first and second conductive elements, where the circuit portion is arranged to measure the mutual capacitance between the first and second conductive elements so as to determine the presence of a touch on the touch interface.

The first and second conductive elements may comprise grids of electrodes, arranged such that the touch interface comprises multiple nodes where the grids intersect. In such embodiments, the circuit portion may be arranged to measure the mutual capacitance of each node individually and sequentially, to enable the position of a touch on the touch interface to be determined. In such cases, the refresh rate (i.e. the rate at which the touch position is updated) is dependent upon the measurement rate of each node and the number of mutual nodes in the entire sensor. It has been recognised that the circuit portion of the present disclosure may be particularly applicable to capacitive matrices comprising tens of nodes, (e.g. <100) where a reasonable screen refresh rate may be provided.

The touch interface may, of course, comprise more than one instance of the capacitance measuring circuit portion, to enable a larger matrix (featuring more nodes) to be used and/or to enable faster measurements (i.e. an increased refresh rate) of a matrix with a given number of nodes.

From a second aspect, the present invention provides a method of indicating a mutual capacitance between a first and second node comprising:

providing a first current to the first node in a first direction providing a variable voltage to the second node so as to hold the first node at a reference voltage;

comparing the variable voltage to a lower threshold voltage;

when the variable voltage reaches the lower threshold voltage, stopping the first current and providing a second current to the first node in a second direction opposite to the first direction;

comparing the variable voltage to an upper threshold voltage; and when the variable voltage reaches the upper threshold voltage, stopping the second current and providing the first current to the first node in the first direction;

wherein a frequency at which the direction of the current is switched is indicative of the mutual capacitance between the first and second nodes.

The frequency at which the direction of the current is switched may be measured to determine the mutual capacitance between the first and second nodes.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

One or more non-limiting examples of the present invention will now be described with reference to the accompanying Figures, in which:

FIG. 1 is a circuit diagram showing a mutual capacitance measurement circuit 2 according to an embodiment of the present invention. The circuit 2 is configured to measure the mutual capacitance 4 between a first node 6 and a second node 8.

Figure 1:
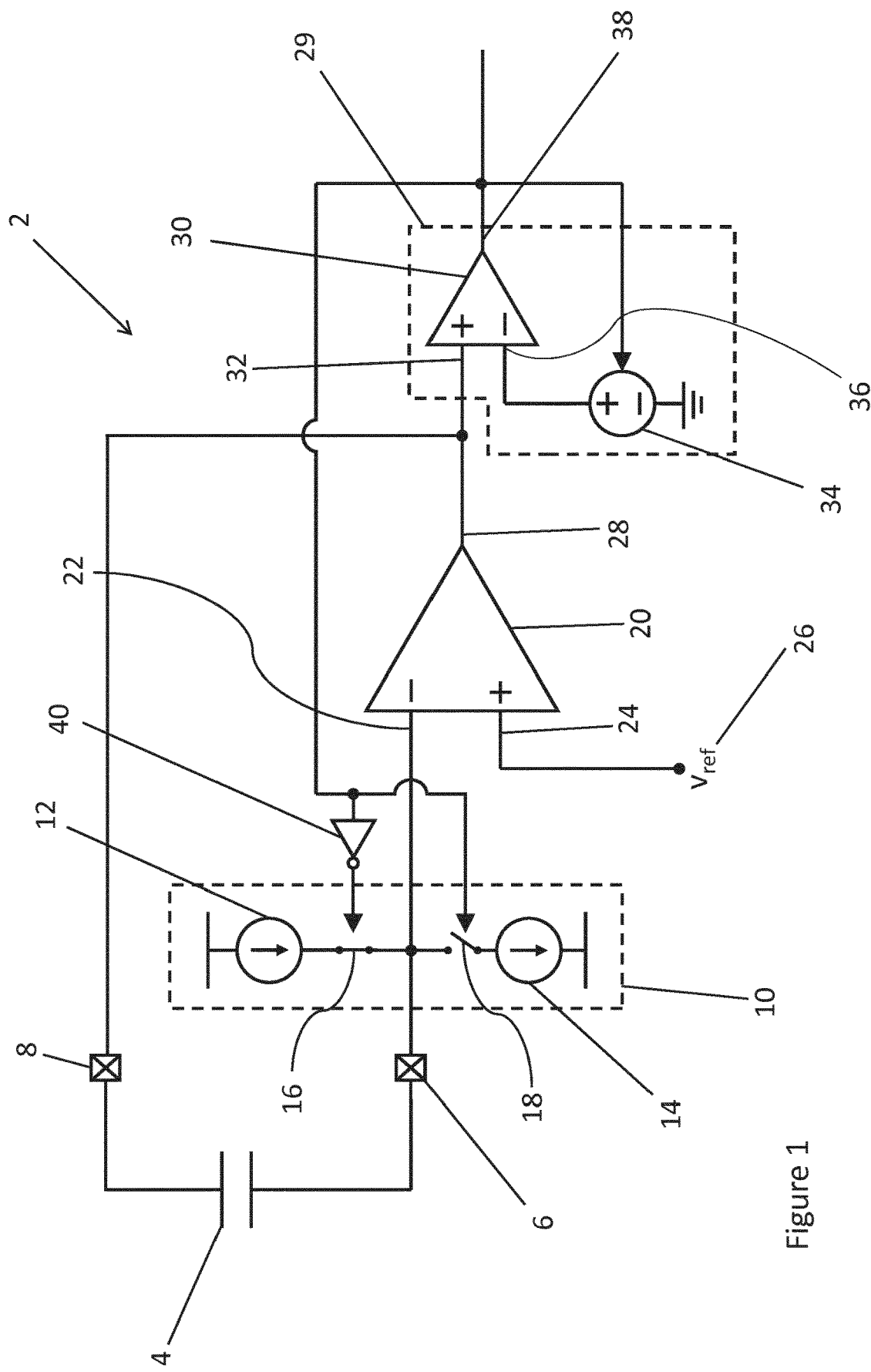
FIG. 1 is a schematic diagram of a circuit portion according to one embodiment of the present invention.

The circuit 2 comprises a current supply section 10, which can be configured to supply a constant current to the first node 6 in either a first direction or a second, opposite, direction. The current supply section 10 comprises a first constant current source 12 arranged to supply a current/flowing in the first direction, and a second constant current source 14 arranged to supply the same current I, but flowing in the opposite direction. The first constant current source 12 is connected to the first node 6 via a first current supply switch 16 and the second constant current source 14 is connected to the first node 6 via a second current supply switch 18. The state (i.e. open or closed) of the first and second current supply switches 16, 18 is controlled by an external signal (indicated by the arrows pointing to the switches 16, 18 in FIG. 1). In the particular example shown here, a high external signal causes a switch 16, 18 to be open (i.e. non-conducting) and a low external signal causes a switch 16, 18 to be closed (i.e. conducting), but of course these might be reversed if consequential changes are made to the rest of the circuit.

The circuit 2 further comprises an operational amplifier 20. An inverting input 22 of the operational amplifier 20 is connected to the first node 6, and a non-inverting input 24 of the operational amplifier 20 is connected to a reference voltage source 26 which provides a constant voltage $V_{ref}$. An output 28 of the operational amplifier 20 is connected to the second node 8, providing a negative feedback loop via the mutual capacitance 4. The current supply section 10, the operational amplifier 20 and the first and second nodes 6, 8 are thus configured as an integrator, wherein the voltage at the output 28 of the operational amplifier 20 is proportional to the time for which a current is supplied by the current supply section 10.

The constant of proportionality (i.e. the rate at which the voltage at the output 28 changes) is dependent upon the magnitude and direction of the current supplied by the current supply section 10 and the mutual capacitance 4 between the first node 6 and the second node 8.

As mentioned above, the voltage provided by the reference voltage source 26 is fixed at $V_{ref}$. The magnitude of the current I supplied by the current supply section 10 is also fixed. The rate at and direction in which the voltage of the output 28 changes is thus a direct indication of the mutual capacitance 4 between the first node 6 and the second node 8.

The circuit 2 further comprises a comparator arrangement 29 which comprises a comparator 30. The output 28 of the operational amplifier 20 is connected to a positive input 32 of the comparator 30, and a switchable reference voltage source 34 is connected to a negative input 36 of the comparator 30. The comparator 30 further comprises a digital output 38, which is high when the voltage at the positive input 32 is greater than the voltage at the negative input 36 (i.e. when the voltage on the output 28 of the operational amplifier 20 is greater than the reference voltage provided by the switchable reference voltage source 34). Otherwise, the digital output 38 is low.

The digital output 38 controls the state of the first and second current supply switches 16, 18. The output 38 is connected to the first supply switch 16 via an inverter 40, and to the second supply switch 18 directly. Thus, when the output 38 is high (the case shown in FIG. 1), a high signal is sent to the second current supply switch 18 and a low signal is sent to the first supply switch 16. This opens the second current supply switch 18 and closes the first supply switch 16, causing current to be supplied to the first node 6 in the first direction. When the output 38 is low, the opposite happens (i.e. current is supplied in the second direction).

The digital output 38 also controls the switchable reference voltage source 34. When the digital output 38 is high, it causes the switchable reference voltage source 34 to output a lower threshold voltage $V_{th\_1}$ and when the digital output 38 is low, it causes the switchable reference voltage source 34 to output an upper threshold voltage $V_{th\_2}$.

The operation of the circuit 2 will now be described with reference to the timing diagrams shown in FIGS. 2, 3 and 4.

Figure 2:
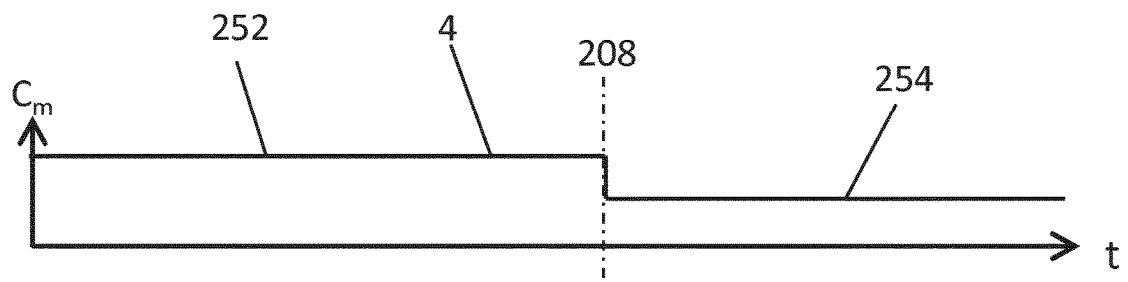
FIGS. 2, 3 and 4 are timing diagrams illustrating the operation of the circuit portion of FIG. 1.

FIG. 2 shows the mutual capacitance between the first and second nodes 6, 8. The output 28 of the operational amplifier 20 is shown as a solid line in FIG. 3 and the voltage provided by the switchable reference voltage source 34 (either $V_{th\_1}$ or $V_{th\_2}$) is indicated on FIG. 3 with a dashed line. FIG. 4 shows the digital output 38.

At a first time 202, the first constant current source 12 of the current supply section 10 supplies a current I to the first node in the first direction and charge builds up at the first and second nodes 6, 8. However, because of the negative feedback loop, the first node 6 is held at the voltage $V_{ref}$ of the voltage reference source 26 by the operational amplifier 20 and the output 28 of the operational amplifier 20 (and thus the voltage at the second node 8) decreases linearly, holding the first node 6 at the reference voltage $V_{ref}$. The switchable reference voltage source 34 provides the lower threshold voltage $V_{th\_1}$. The voltage on the output 28 is greater than the upper threshold voltage $V_{th\_2}$ and the digital output 38 is therefore high.

At a second, later time 204, the output 28 reaches the lower threshold voltage $V_{th\_1}$. The voltage on the output 28 is instantaneously less than the lower threshold voltage $V_{th\_1}$ and the digital output 38 goes low. This, in turn, causes the switchable reference voltage source 34 to provide the upper threshold voltage $V_{th\_2}$, the second current supply switch 18 to close and the first supply switch 16 to open, causing current to be supplied by the second constant current source 14 to the first node 6 in the second direction. The voltage on the output 28 subsequently, therefore, begins to increase.

At a later time 206 the output 28 reaches the upper threshold voltage $V_{th\_2}$. The voltage on the output 28 is instantaneously greater than the upper threshold voltage $V_{th\_2}$ and the digital output 38 goes high. This causes the switchable reference voltage source 34 to once again provide the lower threshold voltage $V_{th\_1}$, and current to be supplied to the first node 6 in the first direction. The voltage on the output 28 subsequently, therefore, begins to decrease again.

Figure 3:
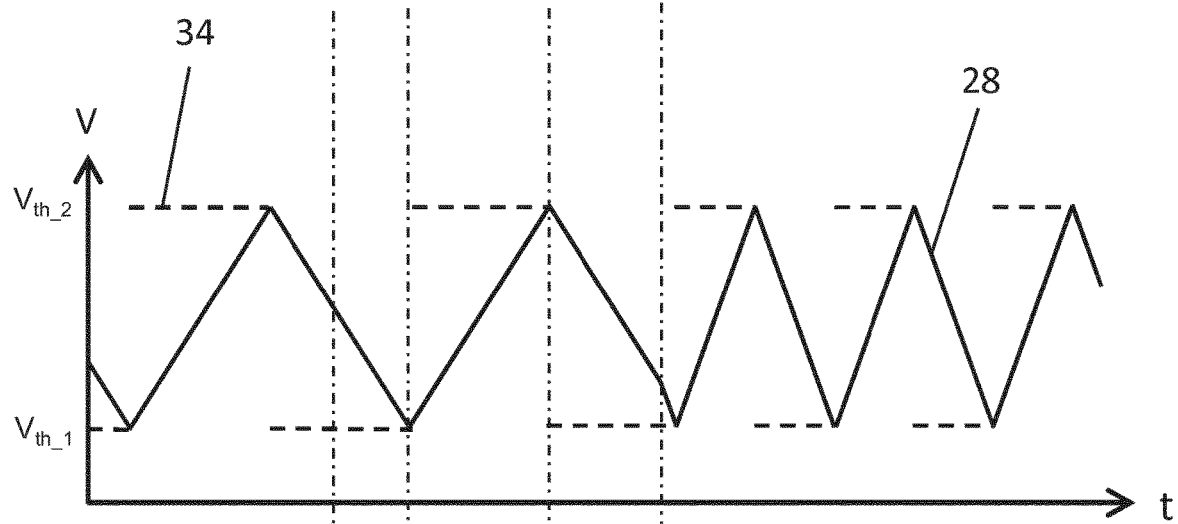
Figure 4:
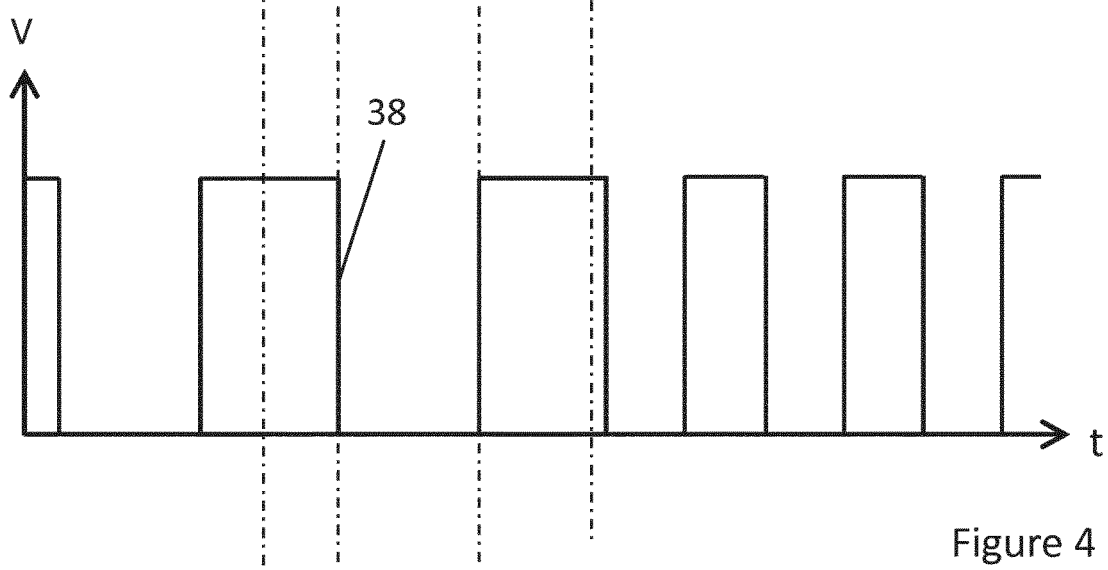

The output 28 continues to oscillate between the lower and upper thresholds $V_{th\_1}$, $V_{th\_2}$, producing the triangular wave seen in FIG. 3 and the square wave on the digital output 38. Because, as mentioned above, the rate at which the voltage at the output 28 changes is directly proportional to the mutual capacitance 4, the frequency of the square wave on the digital output 38 (and of the triangular wave on the output 28) can be used to determine the mutual capacitance 4.

Before a time 208, the mutual capacitance 4 has a first value 252, as seen in FIG. 2. At the time 208 the mutual capacitance 4 decreases to a second value 254 (for example, due to the presence of a user's finger close to the first and second nodes 6, 8).

Due to the decreased mutual capacitance 4, the rate at which the voltage at the output 28 changes increases, and the frequency of the oscillations of both the output 28 and the digital output 38 increases. This frequency change may be measured by additional circuitry (e.g. to detect the presence of the finger).

Figure 5:
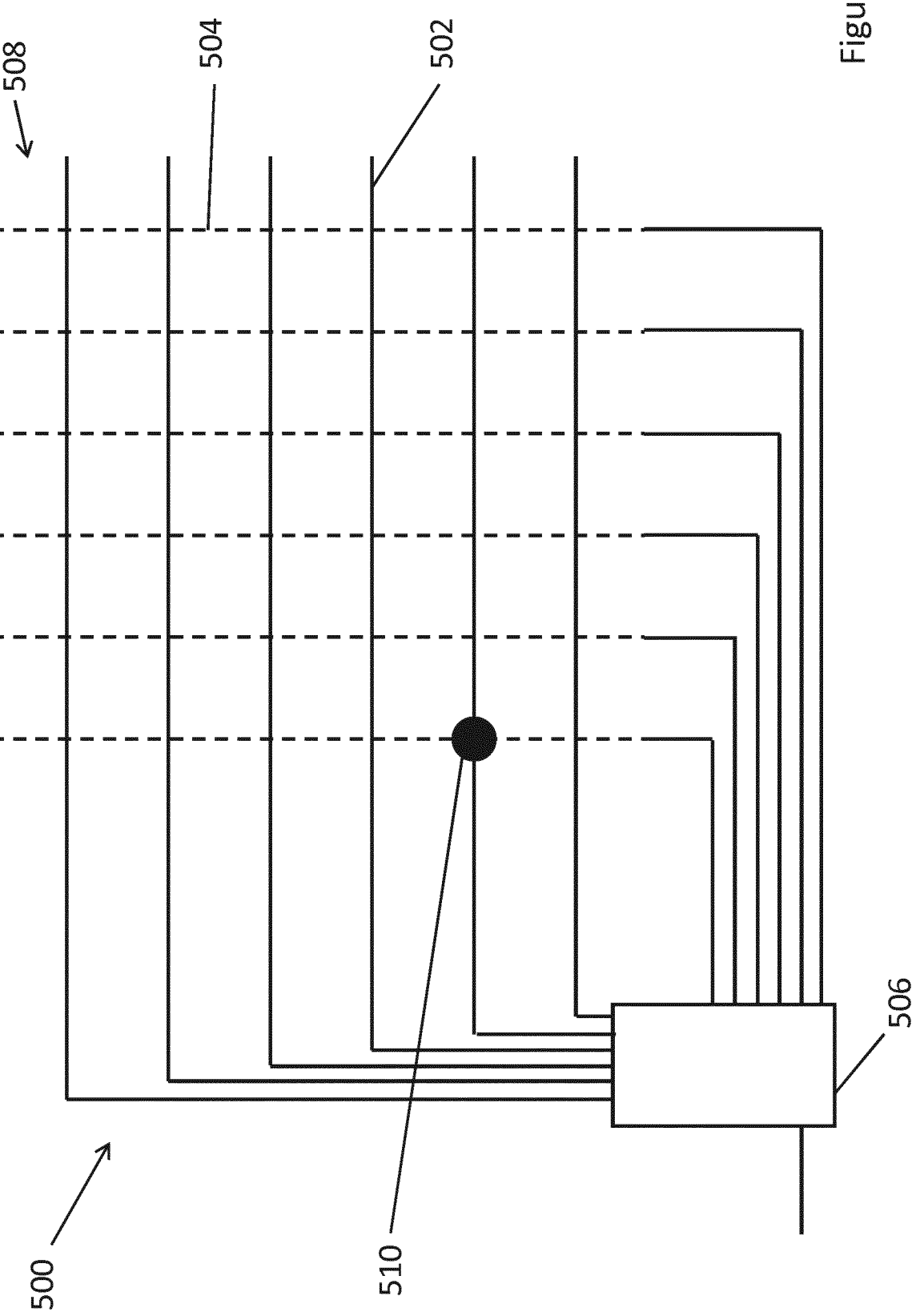
FIG. 5 is a schematic diagram of a touch screen sensor array for which the circuit portion of the present disclosure may be used.

FIG. 5 shows a touch interface 500 comprising first and second conductive grids 502, 504 and a control module 506. The first and second conductive grids 502, 504 each comprise a series of conductive channels which form the rows and columns respectively of a touch detection array 508. The touch detection array 508 is covered with a non-conductive layer (e.g. glass). The first and second conductive grids 502, 504 are not in electrical contact such that there exists a mutual capacitance between each pair of conductive channels.

The control module 506 measures sequentially the mutual capacitance between each pair of channels (i.e. at each intersection of a row and a column) using a circuit portion as described herein. When a user touches the non-conductive layer (e.g. at position 510), the mutual capacitance of the intersection(s) nearest the touch location is decreased. The control module 506 detects this change in mutual capacitance and thus determines the position 510 of the touch.

While the example described above comprises an entire touch detection array 508, the method described herein can of course be used to provide capacitance measurements for much simpler interfaces, e.g. capacitive buttons (just a single point).

The particular embodiment described above is merely exemplary and many possible variants and modifications are envisaged within the scope of the invention as defined in the claims.

The invention claimed is:

1. A circuit portion for indicating a mutual capacitance between a first and second node, the circuit portion comprising:
a switchable constant current source arrangement configured to supply a first current to the first node in a first direction or a second current to the first node in a second, opposite direction;
a variable voltage source configured to output a voltage to the second node so as to hold the first node at a constant reference voltage by a negative feedback loop, such that the voltage output to the second node changes whilst the first node is supplied with the first current or the second current in such a way as to hold the first node at the constant reference voltage whilst it is supplied with the first current or the second current; and
a comparator arrangement configured to switch between said first and second directions of the constant current source when the voltage output to the second node by the variable voltage source reaches a lower threshold voltage or an upper threshold voltage and to output a signal in synchrony with said constant current direction switching;
wherein the signal is indicative of the mutual capacitance between the first and second nodes.

2. The circuit portion as claimed in claim 1, further comprising a frequency measurement section which is arranged to measure a frequency of the signal output from the comparator arrangement and to use the measured frequency to determine said mutual capacitance.

3. The circuit portion as claimed in claim 1, wherein the first and second currents supplied by the constant current source arrangement have the same magnitude.

4. The circuit portion as claimed in claim 1, wherein the variable voltage source comprises an operational amplifier.

5. The circuit portion as claimed in claim 4, wherein the operational amplifier is configured in a negative feedback configuration, with the mutual capacitance connected between the output and an inverting input of the operational amplifier.

6. The circuit portion as claimed in claim 1, wherein the comparator arrangement comprises a comparator with first and second inputs and a digital output.

7. The circuit portion as claimed in claim 6, wherein the first input of the comparator is connected to the output of the variable voltage source and the second input is connected to a switchable reference voltage source, which is switchable between providing the lower threshold voltage and the upper threshold voltage.

8. The circuit portion as claimed in claim 7, wherein the comparator arrangement is further configured to switch the switchable reference voltage between the first reference voltage and the second reference voltage when the voltage output by the variable voltage source reaches the lower threshold voltage or the upper threshold voltage.

9. The circuit portion as claimed in claim 1, wherein the signal output by the comparator arrangement comprises a square wave.

10. A touch interface comprising first and second conductive elements and at least one circuit portion as claimed in claim 1, wherein the at least one circuit portion is arranged to measure the mutual capacitance between the first and second conductive elements so as to determine the presence of a touch on the touch interface.

11. The touch interface as claimed in claim 10, comprising two or more circuit portions as claimed in claim 1.

12. A method of indicating a mutual capacitance between a first and second node comprising:
providing a first current to the first node in a first direction
providing a variable voltage to the second node so as to hold the first node at a constant reference voltage by a negative feedback loop;
comparing the variable voltage provided to the second node to a lower threshold voltage;
when the variable voltage reaches the lower threshold voltage, stopping the first current and providing a second current to the first node in a second direction opposite to the first direction;
comparing the variable voltage provided to the second node to an upper threshold voltage; and
when the variable voltage reaches the upper threshold voltage, stopping the second current and providing the first current to the first node in the first direction;
wherein a frequency at which the direction of the current is switched is indicative of the mutual capacitance between the first and second nodes;
wherein the voltage output to the second node changes whilst the first node is supplied with the first current or the second current in such a way as to hold the first node at the constant reference voltage whilst it is supplied with the first current or the second current.

13. The method as claimed in claim 12, further comprising measuring the frequency at which the direction of the current is switched to determine the mutual capacitance between the first and second nodes.

* * * * *